United States Patent
Chinnakkonda Vidyapoornachary et al.

(10) Patent No.: US 9,760,437 B2
(45) Date of Patent: Sep. 12, 2017

(54) ERROR CORRECTION BASED ON THERMAL PROFILE OF FLASH MEMORY DEVICE

(71) Applicant: International Business Machines Corporation, Armonk, NY (US)

(72) Inventors: Diyanesh B. Chinnakkonda Vidyapoornachary, Bangalore (IN); Vijay Anand Mathiyalagan, TamilNadu (IN); Gary A. Tressler, Sandy Hook, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 64 days.

(21) Appl. No.: 14/789,055

(22) Filed: Jul. 1, 2015

(65) Prior Publication Data
US 2017/0004032 A1   Jan. 5, 2017

(51) Int. Cl.
| | |
|---|---|
| G06F 11/10 | (2006.01) |
| G11C 29/52 | (2006.01) |
| G06F 3/06 | (2006.01) |
| H03M 13/35 | (2006.01) |
| G11C 7/04 | (2006.01) |
| G11C 29/04 | (2006.01) |

(52) U.S. Cl.
CPC ......... *G06F 11/1072* (2013.01); *G06F 3/064* (2013.01); *G06F 3/0619* (2013.01); *G06F 3/0653* (2013.01); *G06F 3/0679* (2013.01); *G06F 11/1048* (2013.01); *G11C 7/04* (2013.01); *G11C 29/52* (2013.01); *H03M 13/356* (2013.01); *G11C 2029/0409* (2013.01); *G11C 2029/0411* (2013.01)

(58) Field of Classification Search
CPC .................................................. G06F 11/1076
USPC ........................................ 714/764, 463, 765
See application file for complete search history.

(56) References Cited

U.S. PATENT DOCUMENTS

| | | |
|---|---|---|
| 7,120,729 B2 | 10/2006 | Gonzalez et al. |
| 7,631,162 B2 | 12/2009 | Gorobets |
| 8,464,106 B2 | 6/2013 | Filor et al. |
| 8,694,719 B2 | 4/2014 | Lassa et al. |
| 2007/0280330 A1* | 12/2007 | Jeong ................... G01K 7/01 374/141 |
| 2011/0010489 A1 | 1/2011 | Yeh |
| 2011/0167319 A1 | 7/2011 | Jeddeloh |
| 2011/0239064 A1 | 9/2011 | Byom et al. |

(Continued)

FOREIGN PATENT DOCUMENTS

| | | |
|---|---|---|
| EP | 2389674 A2 | 11/2011 |
| WO | 2012158521 A1 | 11/2012 |

OTHER PUBLICATIONS

List of IBM Patents or Patent Applications Treated As Related.

*Primary Examiner* — Fritz Alphonse
(74) *Attorney, Agent, or Firm* — Patterson + Sheridan, LLP

(57) ABSTRACT

Systems and methods to manage a memory device by executing program code to determine a temperature profile associated with a region of the memory device. The temperature profile may be one of many temperature profiles each associated with a respective region of the memory device. A correction capability may be determined based on the thermal profile and an error in the memory region may be corrected using the determined correction capability.

20 Claims, 6 Drawing Sheets

(56) References Cited

U.S. PATENT DOCUMENTS

2011/0307758 A1 12/2011 Fillingim
2015/0380111 A1* 12/2015 Rao Subbu ............ G11C 29/52
                                                    714/763

* cited by examiner

ERROR CORRECTION BASED ON THERMAL PROFILE OF FLASH MEMORY DEVICE

I. FIELD OF THE DISCLOSURE

The present disclosure relates generally to computing architectures, and in particular, to a system and a method of managing error corrections in memory.

II. BACKGROUND

Elevated and non-uniform temperatures can negatively impact the reliability of flash memory devices, such as multi-level cell (MLC) NAND and solid state drive (SSD) products. Such reliability impacts become more pervasive as the sizes of flash memory devices are scaled down. In one example, a gradient temperature difference may be present between a top die and a bottom die of a memory stack. In another example, a temperature may be disproportionately higher within a bay of SSDs where heavy write activity is executed. Such temperature gradients can accelerate charge loss and reduce data retention capabilities, leading to increased error rates in the flash memory devices.

Conventional solutions provide error-correcting code (ECC) correction processing that accounts for worst case error scenarios. The same ECC profile is applied to all devices irrespective of position and actual thermal characteristics. The approach can compromise overall ECC efforts. For example, setting the ECC point based on the worst-case temperature profile can result in flash memory consuming more space for ECC blocks than is necessary. Adding more ECC capability can introduce higher latencies and memory requirements, while contributing to less endurance and retention.

III. SUMMARY OF THE DISCLOSURE

According to a particular embodiment, a method of correcting an error in a memory device includes determining a temperature profile associated with a region of a memory device. The temperature profile may be one of a plurality of temperature profiles each associated with a respective region of a plurality of regions of the memory device. A correction capability may be determined based on the thermal profile, and an error in the memory region may be corrected using the determined correction capability.

According to another particular embodiment, an apparatus includes a memory device storing data and program code and a temperature sensor configured to sense a temperature of the memory device. A controller may be in communication with the memory and the temperature sensor. The controller may be configured to execute the program code to determine a temperature profile associated with a region of the memory device. The temperature profile may be one of a plurality of temperature profiles each associated with a respective region of a plurality of regions of the memory device. A correction capability may be determined based on the thermal profile and an error in the memory region may be corrected using the determined correction capability.

According to another particular embodiment, a computer readable storage medium may include instructions that when executed by a processor cause the processor to determine a temperature profile associated with a region of a memory device. The temperature profile may be one of a plurality of temperature profiles each associated with a respective region of a plurality of regions of the memory device. A correction capability may be determined based on the thermal profile, and an error in the memory region may be corrected using the determined correction capability.

Embodiments optimize performance and endurance by balancing correction capability with thermal profiles. Storage space may be preserved in SSDs that are positioned in low temperature regions because fewer bits are used to store ECC program code. A smaller ECC signature further reduces the verification processes of a decoder that validates the integrity of the data. This reduction in processing may translate into less latency. ECC capability may be appropriately set based on a temperature bound and specification, rather than necessarily a worst case capability.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

IV. BRIEF DESCRIPTION OF THE DRAWINGS

FIG. 1 generally illustrates a data processing apparatus configured to support embodiments to optimize error correction in a memory device based on sensed thermal gradients;

V. DETAILED DESCRIPTION

Figure 1:
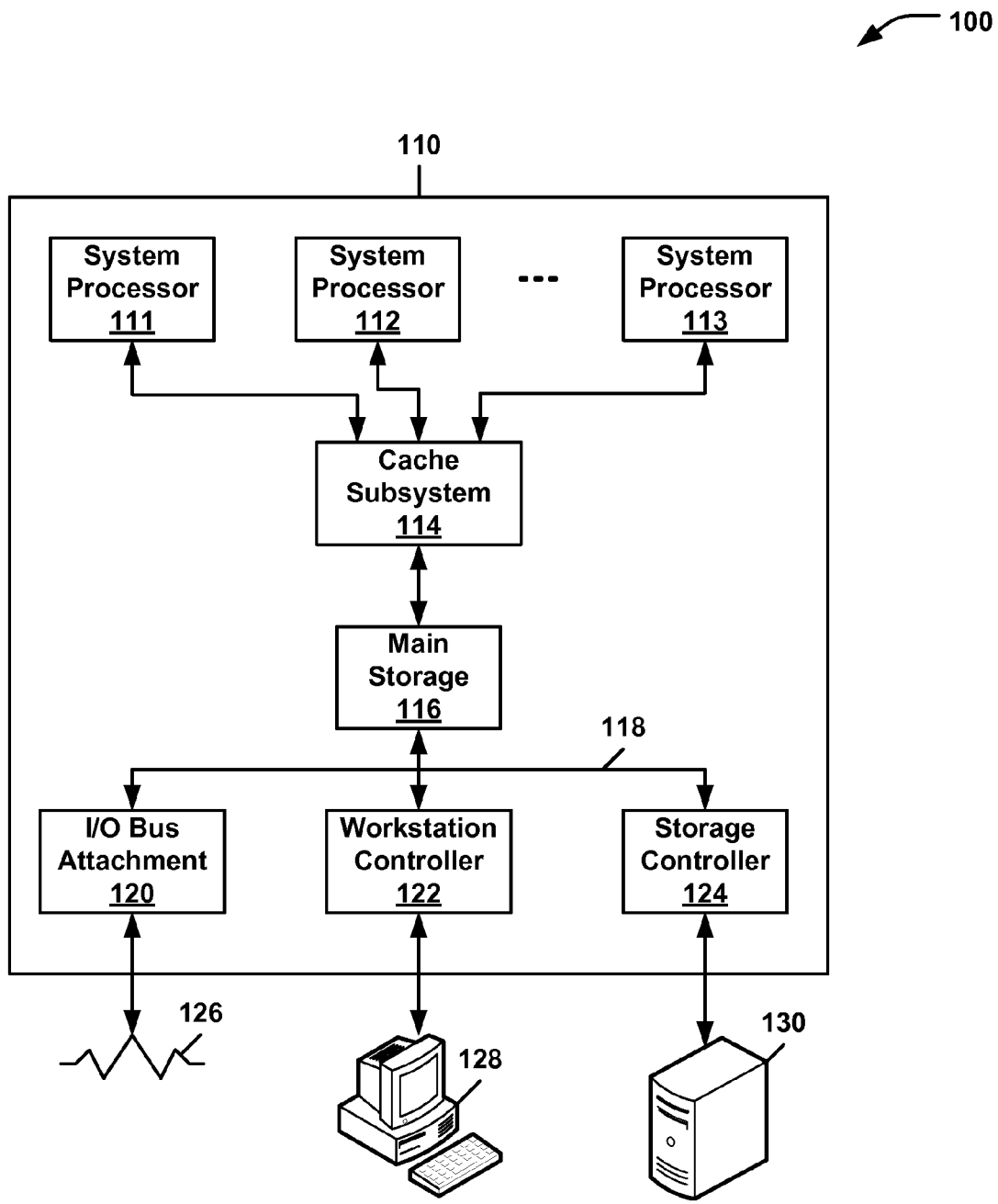

An embodiment of a system and an associated method provides error correction that accounts for temperature gradients between flash memory devices. The system may use relatively stronger error correction (e.g. more error correction bits) for flash memory devices that are in relatively hotter zones than with devices located in relatively cooler zones. An ECC infrastructure may be optimized in response to temperature operating conditions in a manner that does not substantially affect Reliability, Availability, and Serviceability (RAS) performance.

A group of memory devices in a three-dimensional (3D) integrated circuit, or 3D stack, may be grouped into zones based on thermal profiles. Different ECC level decoders may be used for each zone. Each zone may be grouped in such a manner as there is a significant temperature gradient between any two zones. ECC correction capability may be applied for any particular zone as a function of operational temperature range.

According to an embodiment, an adaptive ECC decoder may include varying levels of Bit Error Rate (BER) correction capabilities that correspond to each zone. Correction capability may be adaptively adjusted depending on an association of a data block to a particular zone. The adaptive ECC decoder may be part of either a flash memory controller, or located in the device, itself. The flash memory controller may maintain zone information regarding all blocks as an integral part of a logical-to-physical address table.

According to a particular embodiment, multiple ECC decoders may comprise part of a flash memory controller. In a homogenous stack, each zone may be served by an independent ECC decoder. As such, a number of ECC decoders may correspond to the number of zones. In a heterogeneous stack, a BER rate may be balanced with use of multi-level cell (MLC) grade devices. As such, multiple zones may be served with a pool of ECC decoders. The number of ECC decoders may consequently be less than the total number of zones.

An embodiment of the system may assign ECC resources to a flash memory based on a sensed temperature. Another particular embodiment may perform ECC resource allocation for a memory in a memory server implementation using SSDs.

Multiple SSDs may be packaged into bays. The SSDs may not have a uniform thermal profile across the bay. For example, a bay may have four bays that each exhibit different thermal characteristics. SSDs in a relatively warmer region may benefit from more ECC capability. An SSD may include recommended temperature operating ranges. Absent the processes of an embodiment disclosed herein, SSDs operating in that region may have to be purchased with relatively more ECC capability. The increased ECC may translate into greater expense and storage space (e.g., for ECC code) penalties, contributing to endurance complications.

An embodiment of the system may increase endurance by managing and accounting for an operational temperature range of an SSD. A configurable ECC infrastructure may provide a wider range of correction capability. At server operation run time, the system may determine a temperature of each SSD and generate bias vectors. A bias vector may be indicative of a correction capability determined to be useful for each SSD in a bay or region of a bay. Each bias vector of an embodiment may be associated with a temperature, or temperature range, and a level of error detection capability. The generated bias vectors may be applied such that SSDs placed in a higher temperature region have more correction capability and SSDs that are placed in a lower temperature region have lesser correction capability. An embodiment of the system may sense a temperature profile associated one or a plurality of SSDs and may automatically modify the ECC signature strength in response to the sensed temperature zones.

The runtime temperature may vary depending on the location of an SSD within a bay. The thermal profile may be associated with an error rate and ECC set point that is associated with particular level of correction capability. As such, multiple ECC set points may be associated with multiple temperatures or temperature bounds. ECC capability may be appropriately set based on a temperature bound and specification, rather than necessarily a worst case capability.

A flash controller may include a configurable ECC infrastructure to support and execute a relatively wide range of error correction capabilities. ECC bias vectors may be generated in response to thermal profiles, or a temperature or temperature range associated with each SSD. The ECC bias vectors may be applied such that a higher temperature region may have a stronger error correction capability than a cooler region. Endurance characteristics in the cooler region may be increased because relatively less space may be used for ECC. Low order ECC may have reduced latencies and increased performance.

A flash memory may be packaged as a 3D memory stack. The entire memory stack may be divided into multiple regions, or zones. A temperature gradient (e.g., measured, predetermined temperature threshold) may exist between any two zones. An associated and desired amount of ECC decoders may be applied to the regions, respectively.

An ECC correction capability may be selected and optimized for a particular region based on an operational temperature range. An adaptive ECC decoder may have a varying level of BER correction capability according to the need of the region. Correction capability may be adaptively adjusted depending on an association between a particular data block and a region.

The ECC decoder can be part of a NAND device or may be part of a flash controller. The flash controller may maintain region, or zone, information associated with blocks of the flash memory. For example, the flash controller may maintain a logical-to-physical address table.

According to a particular embodiment, a flash device (e.g., a NAND device) may have a flash controller positioned outside of the memory stack. An ECC decoder may comprise part of the flash controller. According to another embodiment, the ECC decoder may comprise part of the NAND memory package, itself.

Correction capability may be modified dynamically. Multiple ECC decoders may comprise part of a flash controller. Multiple ECC decoders may support both homogenous and heterogeneous stacks. A heterogeneous stack may include die of different sizes and technology. For example, a flash memory package may include eight gigabits of an SLC device in one layer and sixteen gigabits of an MLC device in another layer as just an example. A total number of ECC decoders (managing the zones) may equal the number of zones. A homogeneous flash memory package may include dies of identical technology and sizes. A homogeneous implementation, because of the BER commonality, may be managed by a pool of ECC decoders. The number of ECC decoders may be less than the number of zones.

An ECC decoder may be adaptive in that it may automatically switch from one level of correction capability to a second level of correction capability based on a determination of a zone that includes a block to be decoded. As such, the ECC decoder may have the ability to adapt for any number of bits. Adjusting the error correction capability according to the proper zone will help the data be correct.

In a particular example, a system may include three temperature zones and two ECC decoders. Zone 1 may have a worst thermal profile. The ECC decoder, ECC1, may have the most correction capability and may consequently be mapped, or assigned, to zone 1. The ECC decoder may be selected based on the appropriateness of its grade (e.g., operating specifications, susceptibility to temperature variance) relative to the temperature of a zone. As such, an ECC decoder having relatively less correction capability may be assigned to one or more dies in one or more zones having relatively cool temperature bounds. For example, ECC 2 may be assigned to zones 2 and 3. In this manner, a number of ECC decoders may be reduced.

According to a particular embodiment, each SSD may include its own ECC controller. According to another embodiment, a controller may function to manage multiple ECC tasks for multiple SSDs (e.g., in a bay or region). The ECC controller may comprise a controller or a flash memory device of an SSD. According to a particular embodiment, separate logic of an SSD may execute methods to set ECC levels according to temperature.

A thermal profile or temperature gradient of a memory stack may be determined according to an amount of power is useful to a die, in addition to a location of the die within the memory stack. The power consumption and position of each die in the memory stack may be predictable. The BER of the MLC devices may also be known, so a device with a worst BER may be positioned in a coolest position within a coolest zone. A device with a second worst BER may be positioned in a second coolest position.

ECC correction capability may be optimized selecting an optimal number of ECC bits for a given thermal profile. With a flash chip in a coolest position may have a minimal BER because the temperature has a relatively smaller impact. Consequently, an ECC decoder with less correction capability may be used. A number of required bits may be reduced and data may be processed faster because fewer bits are used. Additionally, endurance, or lifetime of blocks, may be increased because a fewer number of bits may be used for ECC during a write.

According to a particular embodiment, only one ECC decoder may be used. Devices in a 3D memory stack may have only a required level of ECC signature, reducing the spare area needed to store ECC bits. An embodiment of a system may include a dynamically configurable adaptive ECC decoder. For different required levels of ECC, an ECC decoder may be configured to be an n-bit ECC decoder, where n-bit represents only required bits needed for data reliability for a particular device in a memory stack. For instance, a 3D memory stack may be logically divided into three zones that each requires a different number bit ECC decoder. A controller may have only one ECC decoder that may be configured into a different number bit decoder, depending on the device needing the data operation.

A thermal profile for an SSD may be determined based on activity (e.g., read and write operations, as well as cooling airflow). As fan speeds and read/write operations can vary, the thermal profile may change and be adjusted for dynamically.

At a point in time that is coincident with when the system is operating at maximum power, temperature may remain generally constant. Such may be the case, for instance, in a NAND package where only one device is accessed at any one time. In another type of package, the power and temperature may continue to change depending on how many dies are used.

According to a particular example, an MLC grade device may be chosen for placement within a memory stack based upon a zone (and thus an associated correction capability appropriate for the MLC grade device). A system may determine the presence of multiple zones having different temperature gradients. An MLC device may be selected from multiple MLC devices having different grades. The MLC device may be selected based on the appropriateness of its grade (e.g., operating specifications, susceptibility to temperature variance) relative to the temperature of a zone. As such, an MLC device that is relatively susceptible to temperature (e.g., only needs correction capability when hot) may be placed in a zone having a relatively cool temperature bound. Conversely, an MLC device having less susceptibility to temperature may be placed in a zone having a relatively warmer temperature bound. This technique may reduce processing and storage attributable to error correction.

Turning more particularly to the drawings, FIG. 1 generally illustrates a data processing apparatus 100 configured to support embodiments to optimize error correction in a memory device based on sensed thermal gradients. The apparatus 100 may generally include a computer, a computer system, a computing device, a server, a disk array, client computing entity, or other programmable device, such as a multi-user computer, a single-user computer, a handheld device, a networked device (including a computer in a cluster configuration), a mobile phone, a video game console (or other gaming system), etc. The apparatus 100 may be referred to as a logically partitioned computing system or computing system, but may be referred to as computer for the sake of brevity. One suitable implementation of the computer 110 may be a multi-user computer, such as a computer available from International Business Machines Corporation (IBM).

The computer 110 generally includes one or more physical processors 111, 112, 113 coupled to a memory subsystem including a main storage 116. The main storage 116 may include one or more STT-MRAMs. Another or the same embodiment may include a main storage having a static random access memory (SRAM), a dual in-line memory module (DIMM) a flash memory, a hard disk drive, and/or another digital storage medium. The processors 111, 112, 113 may be multithreaded and/or may have multiple cores. A cache subsystem 114 is illustrated as interposed between the processors 111, 112, 113 and the main storage 116. The cache subsystem 114 typically includes one or more levels of data, instruction and/or combination caches, with certain caches either serving individual processors or multiple processors.

The main storage 116 may be coupled to a number of external input/output (I/O) devices via a system bus 118 and a plurality of interface devices, e.g., an I/O bus attachment interface 120, a workstation controller 122, and/or a storage controller 124 that respectively provide external access to one or more external networks 126, one or more workstations 128, and/or one or more storage devices 130, such as a direct access storage device (DASD). In a particular embodiment, the storage device 130 may include an STT-MRAM. The system bus 118 may also be coupled to a user input (not shown) operable by a user of the computer 110 to enter data (i.e., the user input sources may include a mouse, a keyboard, etc.) and a display (not shown) operable to display data from the computer 110 (i.e., the display may be a CRT monitor, an LCD display panel, etc.). The computer 110 may also be configured as a member of a distributed computing environment and communicate with other members of that distributed computing environment through a network 126.

Figure 2:
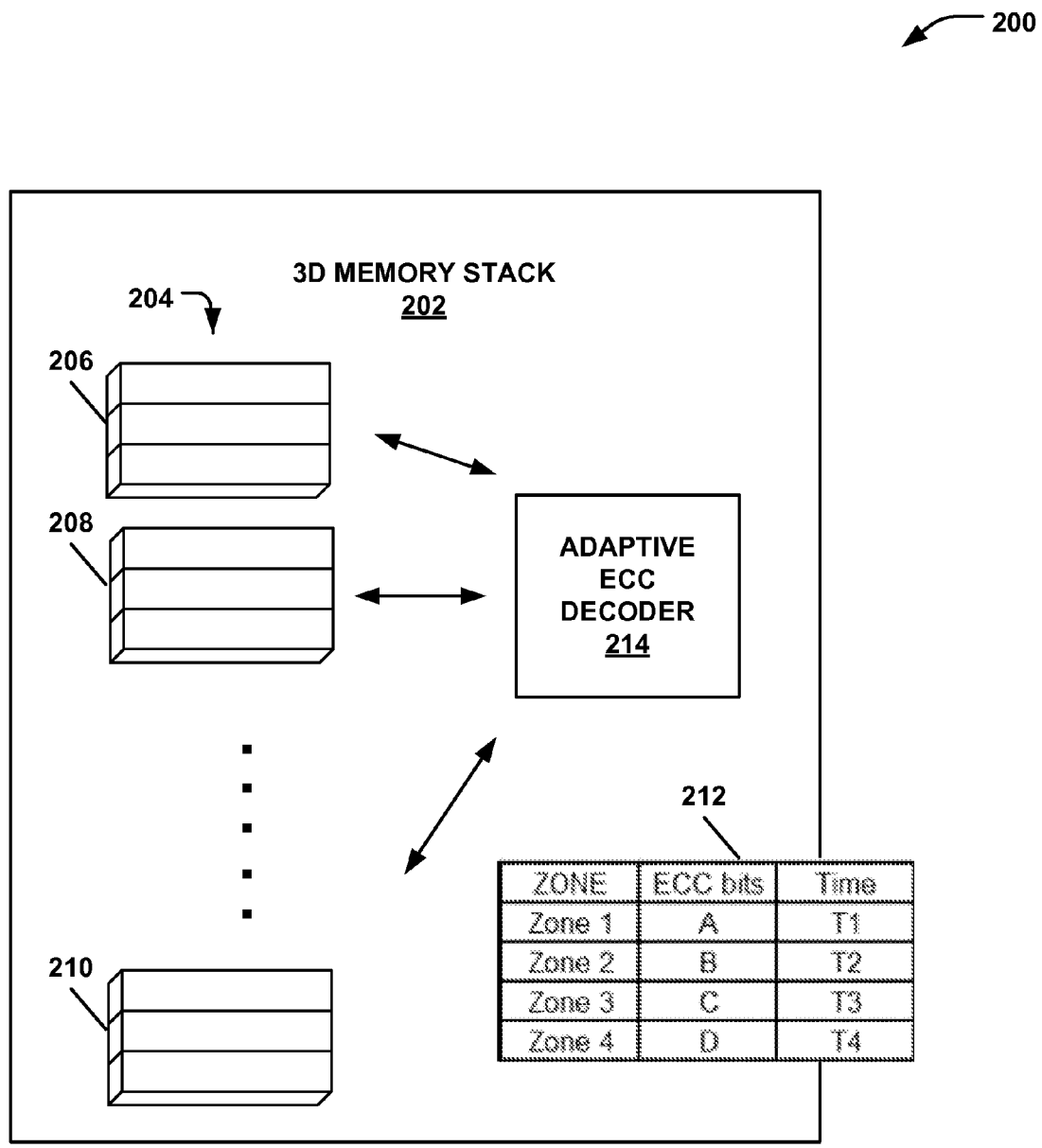
FIG. 2 shows an embodiment of a system that includes a 3D memory stack having error correction capabilities that are adaptively adjusted according to a sensed temperature.

FIG. 2 shows an embodiment of a system 200 that includes a 3D memory stack 202 having error correction capabilities that are adaptively adjusted according to a sensed temperature. The 3D memory stack 202 may comprise a NAND package. The dies of the 3D memory stack 202 may be divided into regions, or zones 206, 208, 210. One or more dies typically comprise a zone 206, 208, 210. Additionally, noncontiguous dies may be in a common region. As shown in FIG. 2, zone 1 (206) may be associated with a first temperature bound, and zone 2 (208) may be associated with a second temperature bound. Zone 3 (210) may be associated with a third temperature bound. The first temperature bound may be hotter than the second temperature bound, and the second temperature bound may be hotter than the third temperature bound.

The associations may be mapped in a logical-to-physical address table. In addition to containing logical and physical addresses, data in the logical-to-physical address table may include information shown in the table 212. That information may further associate a die with a time used for decoding, as well as with error correction ability (e.g., number of bits available for ECC operations). For example, zone 1 (206), having a relatively higher temperature, may be associated with a relatively large number of ECC bits, A, as well as with a relatively higher relatively longer time, T1, to decode data. More time breaks may be used to decode data in a warmer zone. In the example, zone 1 (206) may be the warmest temperature gradient, with zone 2 (208) being the next coolest, followed by zone 3 (210) and zone n (not shown), respectively. A corresponding number of bits, A, may be the largest number, followed by B, C, D, respectively. T1 may be the longest time, with T2 being the next longest time used for decoding, followed by T3 and T4, respectively. The time for the ECC decoder to switch to a different correction capability may introduce a relatively short latency. As such, zone information may be added to the physical address in the address translation table. The address translation table may specify the number of ECC bits needed for a microchip in the 3D stack 202 based on the thermal profile.

An ECC decoder 214 may be adaptive in that it may automatically switch from one level of correction capability to a second level of correction capability based on a determination of a zone that includes a block to be decoded. As such, the ECC decoder may have the ability to adapt for any number of bits. Adjusting the error correction capability according to the proper zone facilitate data correction.

Figure 3:
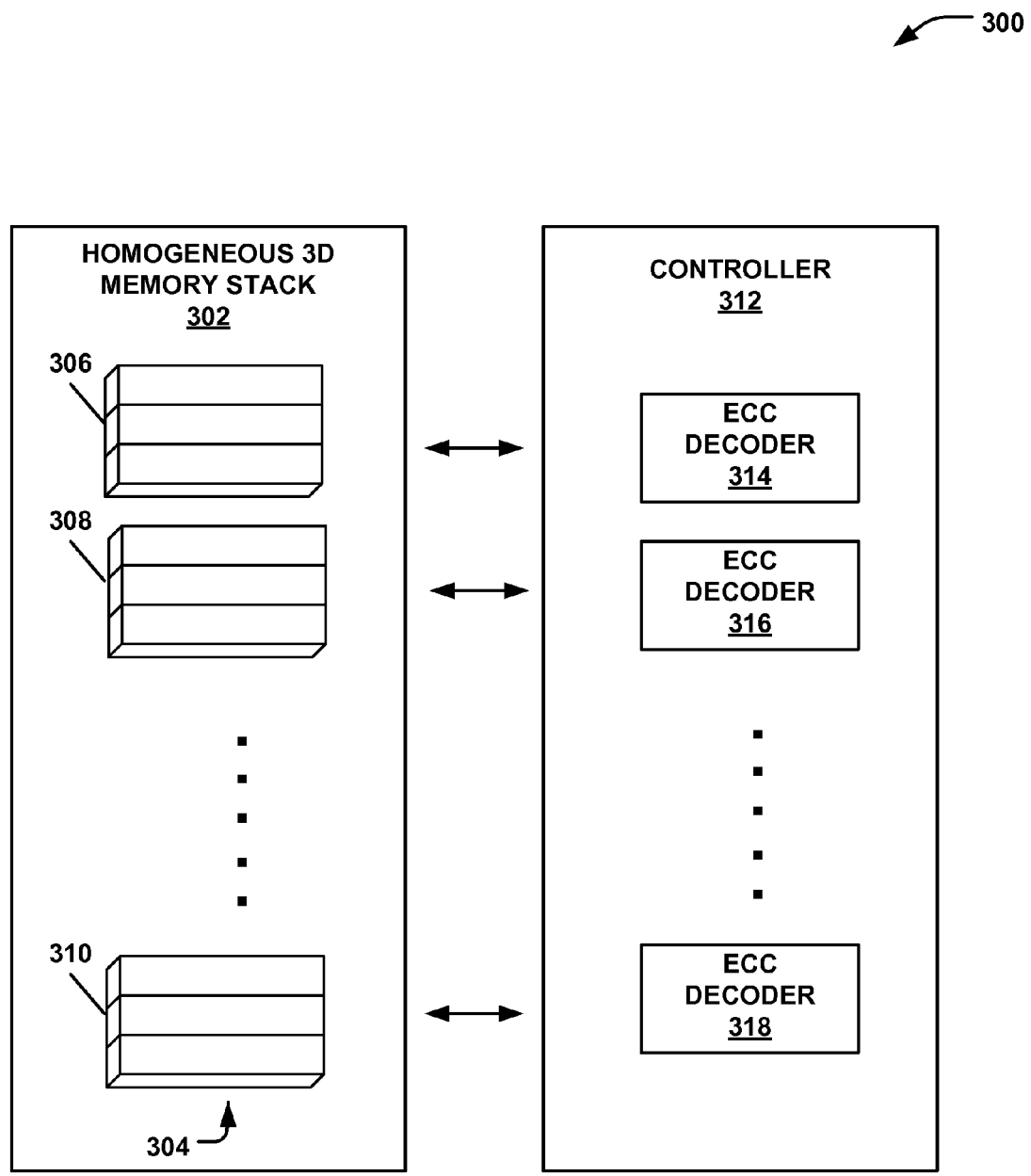
FIG. 3 illustrates an embodiment of a system that includes a homogenous 3D stack having dies that include similar or identical characteristics.

FIG. 3 illustrates an embodiment of a system 300 that includes a homogenous 3D stack 302 having dies 304 that include similar or identical characteristics. The dies 304 may be associated with different temperature zones 306, 308, 310 and error correction capabilities. The dies 304 may be divided into zones 306, 308, 310 based on temperature gradients. A memory controller (e.g., a flash memory controller) 312 may include one or more ECC decoders 314, 316, 318 that includes ECC information pertaining to each zone 306, 308, 310.

The decoder 318 having the greatest corrective capability may be automatically assigned to the zone 310 having a warmest temperature. The decoder 316 having the next most corrective capability may be automatically assigned to the zone 308 having the next warmest temperature. The decoder 314 having the least corrective capability may be automatically assigned to the zone 306 having a coolest temperature. Zones 306, 308, 310 may be matched to ECC decoders 314, 316, 318 based on thermal specifications, allocating bits more efficiently and saving space for data.

Figure 4:
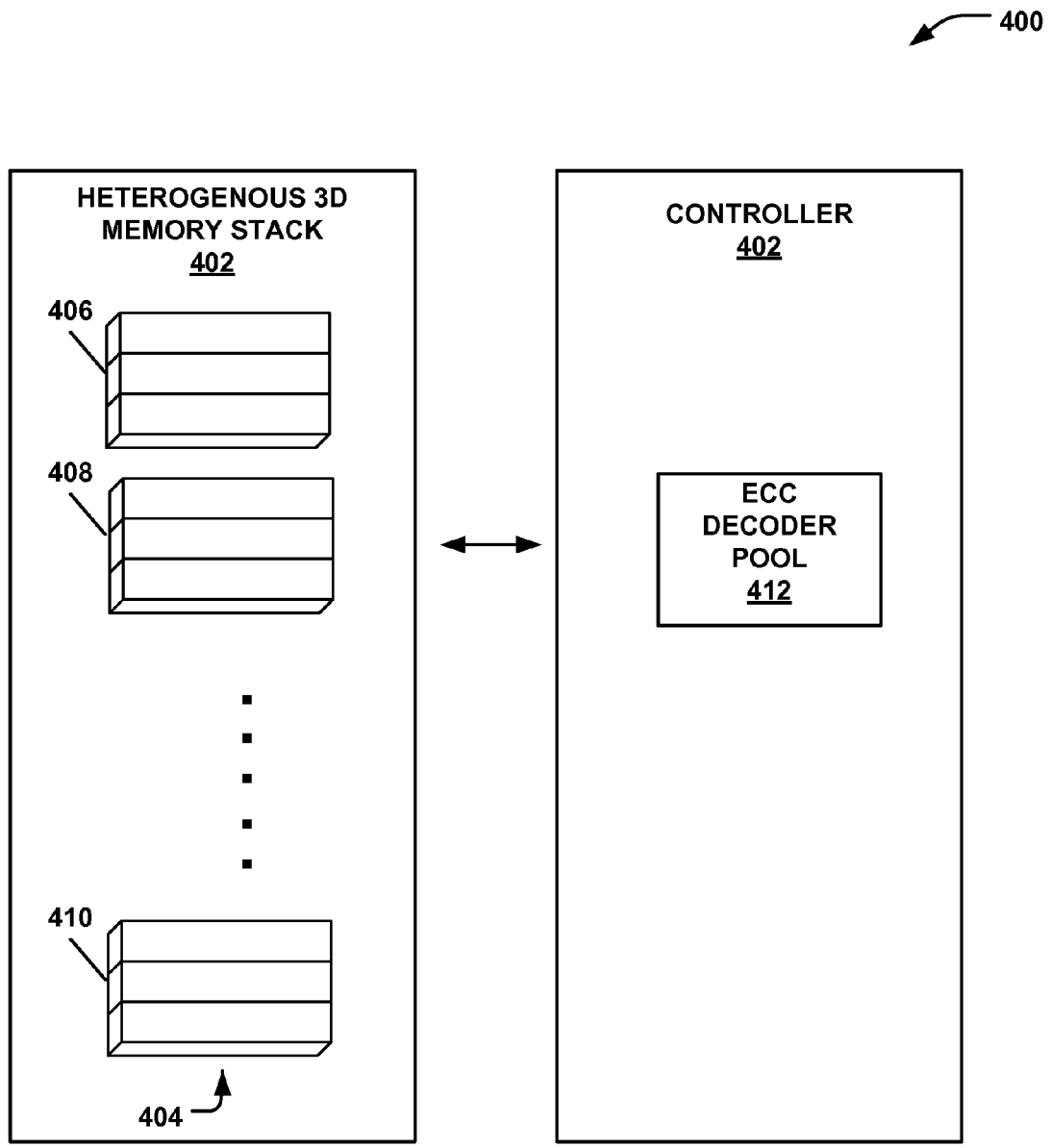
FIG. 4 illustrates an embodiment of a system that includes a heterogeneous 3D stack having dies that include dissimilar characteristics.

FIG. 4 illustrates an embodiment of a system 400 that includes a heterogeneous 3D stack 402 having dies 404 that include dissimilar characteristics. The dies 404 may be associated with different temperature zones and error correction capabilities. In a heterogeneous stack, a BER rate may be balanced with use of MLC grade devices. As such, multiple zones 406, 408, 410 may be served with a pool of ECC decoders. The number of ECC decoders may consequently be less than the total number of zones 406, 408, 410.

Figure 5:
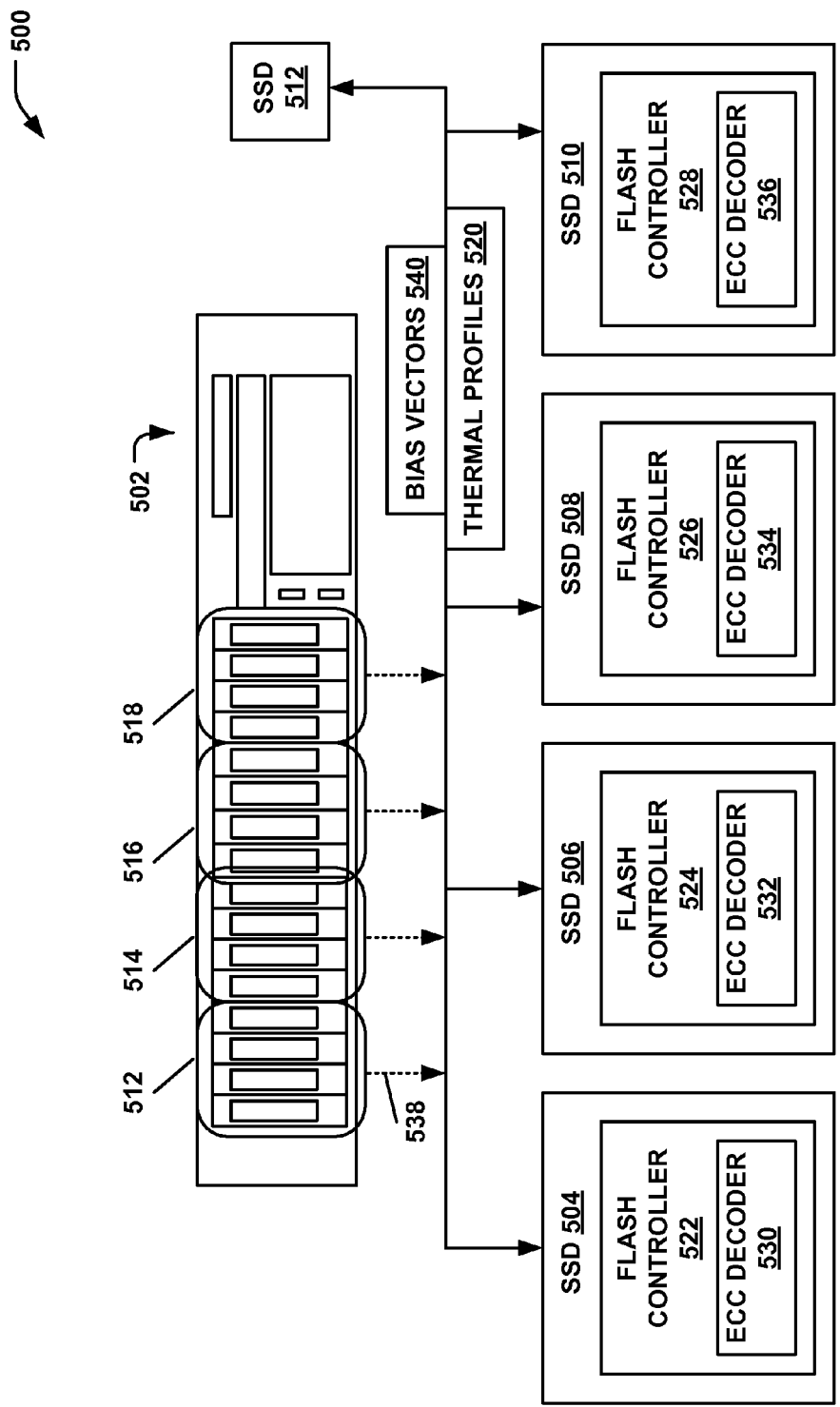
FIG. 5 shows an embodiment of a system that includes a bay of SSDs having error correction capabilities that are based in part on thermal temperature gradients.

FIG. 5 shows an embodiment of a system 500 that includes a bay of SSDs 502 having error correction capabilities that are based in part on thermal temperature gradients. Block diagrams of SSDs 504, 506, 508, 510, 512 may represent a portion of the SSDs positioned with the memory device 502. Each SSD 504, 506, 508, 510, 512 may include a flash controller 522, 524, 526, 528, in addition to an ECC decoder 530, 532, 534, 536.

The bay of SSDs 502 may be logically divided into regions 512, 514, 516, 518 based on temperature gradients. Each region 512, 514, 516, 518 may include multiple one or more SSDs and may be associated with a plurality of thermal profiles 520. A region may include noncontiguous SSDs (i.e., SSD separated by another SSD that is not in the same region). The thermal profiles 520 may be generated in response to heat 538 detected at the bay of SSDs 502. The thermal profiles 520 may be used to generate bias vectors 540. The bias vectors 540 may be communicated to the ECC decoders 530, 532, 534, 536 of an individual SSD 504, 506, 508, 510 or to an SSD 512 that handles ECC decoding for multiple SSDs.

A server box, such as the bay of SSDs 502, may include multiple SSD stacks. The SSDs may be automatically categorized into different regions 512, 514, 516, 518 based on sensed temperatures. In this manner, each SSD 504, 506, 508, 510 may have a tailored correction level. For instance, a region having a relatively higher temperature and associated higher correction level requirement may be serviced by an ECC decoder meeting that need. An SSD in a cooler region may be processed user a weaker ECC level. A weaker ECC level may use less storage (e.g., fewer bits). Each SSD 504, 506, 508, 510 may profile its own temperature and generate a bias vector 540. Each SSD 504, 506, 508, 510 may include one or more temperature sensors (not shown) used to determine the temperature profile 520 and bias vector 540. The bias vector 540 may be communicated to a controller 522, 524, 526, 528. The controller 522, 524, 526, 528 may select an appropriate ECC set point based on the detected temperature bound. This approach to ECC is adaptive, self-learning (e.g., temperature profiling), and configurable in that ECC set points may be continuously set according to changing temperature bounds.

Figure 6:
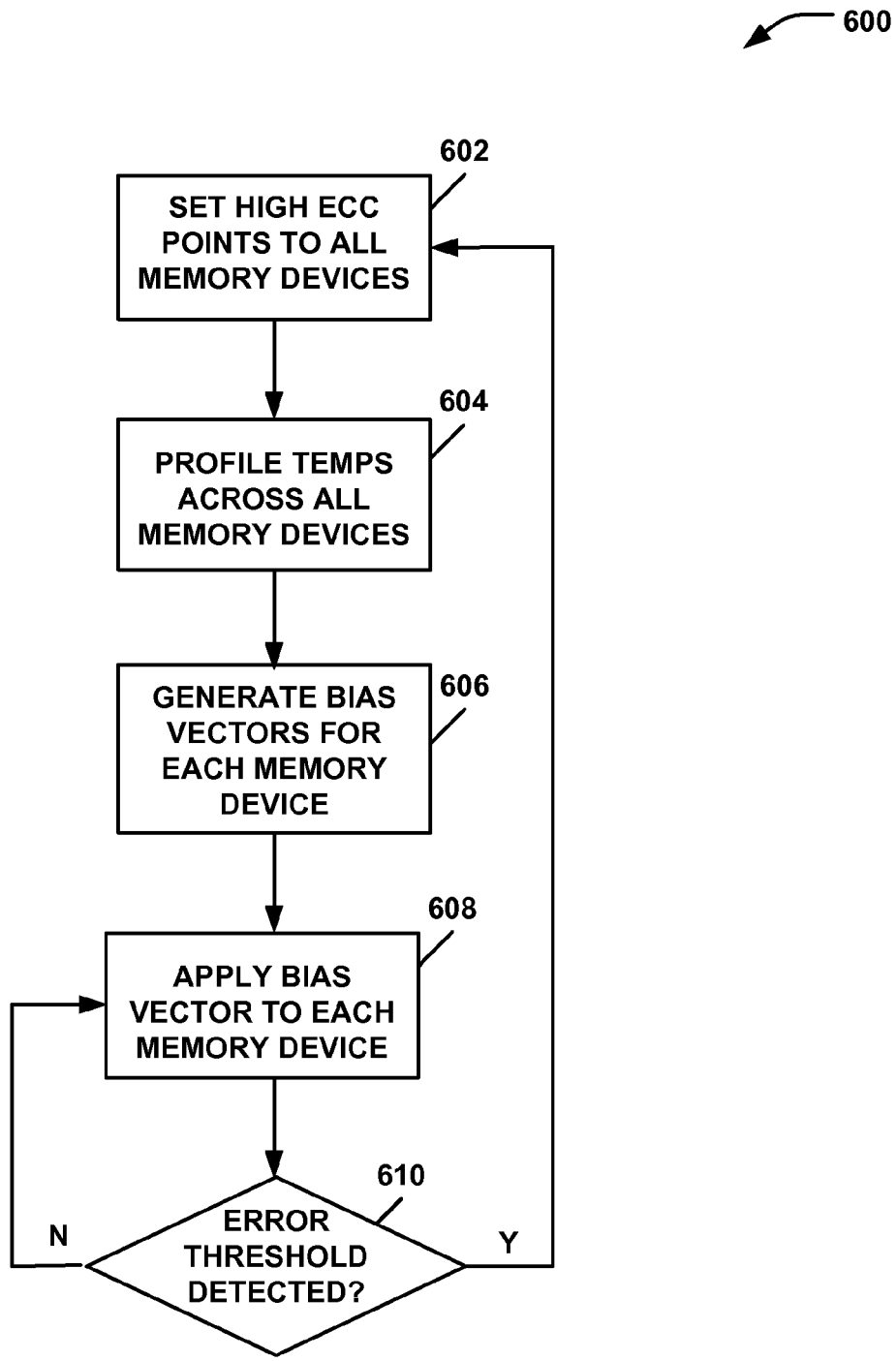
FIG. 6 is a flowchart of an embodiment of a method of setting ECC set points in a stack of SSDs according to a detected temperature.

FIG. 6 is a flowchart of an embodiment of a method 600 of setting ECC set points in a stack of SSDs according to a detected temperature. The method may be performed in an environment similar to those described in FIGS. 1-5.

At system startup, a correction capability may be set at 602 to a highest supported ECC set point for an SSD. Starting with a highest correction capability may facilitate the availability of an adequate number of bits for decoding (should the bits be needed based on sensed high temperatures).

At initial runtime, temperature profiling (e.g., self-learning) may begin at 604. Temperatures may be profiled to get ECC bias vector information after a set number of cycles (e.g., after workloads are accessing the SSDs). The thermal profile may consequently be stable (e.g., at steady state) to avoid prematurely cool temperatures and inaccurate bias vectors. According to a particular embodiment, a profile may be determined once SSDs have experienced a specified traffic condition (e.g., I/O operations/second). A traffic condition, or status, may affect temperature at an SSD. As such, ECC set points may be set according to when the SSD senses that it has reached a stable traffic condition, at which time it may begin thermal profiling. Trigger points for profiling may depend on how much traffic flowed recently in a pack.

ECC bias vectors may be generated 606. The ECC bias vectors may be generated according to the sensed temperature bounds. A bias vector may be indicative of a correction capability determined to be useful for each SSD in a bay or region of a bay. Each bias vector of an embodiment may be associated with a temperature, or temperature range, and a level of error detection capability.

At runtime, the ECC profiling may be applied at 608 to enable dispersed ECC set by communicating the ECC bias vectors to an ECC controller. The generated bias vectors may be applied such that SSDs placed in a higher temperature region have more correction capability and SSDs that are placed in a lower temperature region have lesser correction capability. The ECC controller may initiate an implementation of an associated level of ECC capability.

According to a particular embodiment, a reassessment at 602 of a bias vector may be initiated at 610 when a threshold of data errors is detected. An embodiment of the system may sense a temperature profile associated one or a plurality of SSDs and may automatically modify the ECC signature strength in response to the sensed, changing temperature zones.

Using the method 600, storage space may be preserved in SSDs that are positioned in low temperature regions because fewer bits are used to store ECC program code. A smaller ECC signature further reduces the verification processes of a decoder that validates the integrity of the data. This reduction in processing may translate into less latency. ECC capability may be appropriately set based on a temperature bound and equipment specifications, rather than necessarily a worst case capability, ultimately improving endurance and retention.

Particular embodiments described herein may take the form of an entirely hardware embodiment, an entirely software embodiment or an embodiment containing both hardware and software elements. In a particular embodiment, the disclosed methods are implemented in software that is embedded in processor readable storage medium and executed by a processor, which includes but is not limited to firmware, resident software, microcode, etc.

Further, embodiments of the present disclosure, such as the one or more embodiments may take the form of a computer program product accessible from a computer-usable or computer-readable storage medium providing program code for use by or in connection with a computer or any instruction execution system. For the purposes of this description, a non-transitory computer-usable or computer-readable storage medium may be any apparatus that may tangibly embody a computer program and that may contain, store, communicate, propagate, or transport the program for use by or in connection with the instruction execution system, apparatus, or device.

In various embodiments, the medium may include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and digital versatile disk (DVD).

A data processing system suitable for storing and/or executing program code may include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. An apparatus comprising:
   a memory device storing data and program code;
   a temperature sensor configured to sense a temperature of the memory device;
   a controller in communication with the memory and the temperature sensor, the controller configured execute the program code to:
     determine a temperature profile associated with a region of the memory device, wherein the temperature profile is one of a plurality of temperature profiles each associated with a respective region of a plurality of regions of the memory device;
     determine a correction capability based on the thermal profile; and
     correct an error in the memory region using the determined correction capability; and
   a logical-to-physical address table maintaining information associating the plurality of temperature profiles with the plurality of regions.

2. The apparatus of claim 1, wherein the controller is further configured to generate a bias vector indicative of the correction capability.

3. The apparatus of claim 1, wherein the controller is further configured to associate the plurality of regions with a plurality of correction capabilities.

4. The apparatus of claim 1, wherein the controller is further configured to set a plurality of set points based on a plurality of changing temperature bounds.

5. The apparatus of claim 1, wherein the thermal profile is determined at runtime, and wherein the correction capability is set at system startup to a highest supported error-correcting code (ECC) set point for the memory device.

6. An apparatus comprising:
   a memory device storing data and program code;
   a temperature sensor configured to sense a temperature of the memory device; and
   a controller in communication with the memory and the temperature sensor, the controller configured execute the program code to:
     determine a temperature profile associated with a region of the memory device, wherein the temperature profile is one of a plurality of temperature profiles each associated with a respective region of a plurality of regions of the memory device;
     determine a correction capability based on the thermal profile; and
     correct an error in the memory region using the determined correction capability, wherein the controller is further configured to generate a bias vector indicative of the correction capability.

7. The apparatus of claim 6, wherein the memory device is divided into a plurality of regions based on a temperature gradient.

8. The apparatus of claim 6, wherein the controller is further configured to communicate the bias vector to an error-correcting code (ECC) decoder.

9. The apparatus of claim 6, further comprising a logical-to-physical address table maintaining information associating the plurality of temperature profiles with the plurality of regions.

10. The apparatus of claim 6, wherein the controller is configured to determine the temperature profile in response to at least one of a determined runtime, a specified traffic-related condition, and a set number of cycles.

11. The apparatus of claim 6, wherein the controller is further configured to associate the plurality of regions with a plurality of correction capabilities.

12. The apparatus of claim 6, wherein the controller is further configured to set a plurality of set points based on a plurality of changing temperature bounds.

13. The apparatus of claim 6, wherein the thermal profile is determined at runtime, and wherein the correction capability is set at system startup to a highest supported error-correcting code (ECC) set point for the memory device.

14. An apparatus comprising:
a memory device storing data and program code;
a temperature sensor configured to sense a temperature of the memory device; and
a controller in communication with the memory and the temperature sensor, the controller configured execute the program code to:
determine a temperature profile associated with a region of the memory device, wherein the temperature profile is one of a plurality of temperature profiles each associated with a respective region of a plurality of regions of the memory device;
determine a correction capability based on the thermal profile, wherein the thermal profile is determined at runtime, and wherein the correction capability is set at system startup to a highest supported error-correcting code (ECC) set point for the memory device; and
correct an error in the memory region using the determined correction capability.

15. The apparatus of claim 14, further comprising a logical-to-physical address table maintaining information associating the plurality of temperature profiles with the plurality of regions.

16. The apparatus of claim 14, wherein the memory device is divided into a plurality of regions based on a temperature gradient.

17. The apparatus of claim 14, wherein the controller is further configured to generate a bias vector indicative of the correction capability.

18. The apparatus of claim 17, wherein the controller is further configured to communicate the bias vector to an error-correcting code (ECC) decoder.

19. The apparatus of claim 14, wherein the controller is further configured to associate the plurality of regions with a plurality of correction capabilities.

20. The apparatus of claim 14, wherein the controller is further configured to set a plurality of set points based on a plurality of changing temperature bounds.

* * * * *